US010768248B2

(12) United States Patent
Bandara et al.

(10) Patent No.: US 10,768,248 B2
(45) Date of Patent: Sep. 8, 2020

(54) NMR PROBE HEAD WITH A BACKBONE IN THE SHIELDING TUBE

(71) Applicant: Bruker BioSpin GmbH, Rheinstetten (DE)

(72) Inventors: Priyanga Bandara, Karlsruhe (DE); Ralf Haueisen, Karlsruhe (DE); Juergen Ganz, Ettlingen (DE); David Osen, Ettlingen (DE); Martin Armbruster, Archern (DE); Alexander Krahn, Karlsruhe (DE)

(73) Assignee: BRUKER BIOSPIN GMBH, Rheinstetten (DE)

( * ) Notice: Subject to any disclaimer, the term of this patent is extended or adjusted under 35 U.S.C. 154(b) by 0 days.

(21) Appl. No.: 16/285,360

(22) Filed: Feb. 26, 2019

(65) Prior Publication Data
US 2019/0265315 A1    Aug. 29, 2019

(30) Foreign Application Priority Data

Feb. 26, 2018    (DE) .................. 10 2018 202 890

(51) Int. Cl.
*G01R 33/30* (2006.01)
*G01R 33/31* (2006.01)
(Continued)

(52) U.S. Cl.
CPC ........... *G01R 33/307* (2013.01); *G01R 33/30* (2013.01); *G01R 33/31* (2013.01); *G01R 33/422* (2013.01); *G01R 33/46* (2013.01)

(58) Field of Classification Search
CPC ...... G01R 33/30; G01R 33/307; G01R 33/31; G01R 33/34; G01R 33/345; G01R 33/422; G01R 33/46
(Continued)

(56) References Cited

U.S. PATENT DOCUMENTS 2,908,858 A    10/1959  Nelson
3,548,297 A *  12/1970  Van Geet ............... G01R 33/31
                                                    324/321
(Continued)

FOREIGN PATENT DOCUMENTS

DE          1017671 A    10/1957
DE     102013201110 B3    4/2014
(Continued)

OTHER PUBLICATIONS

Behr et al., "A Novel Modular Probe Base Design", Concepts in Magnetic Resonance Part B (Magnetic Resonance Engineering), vol. 33B(1), 2008, pp. 55-61.
(Continued)

*Primary Examiner* — Steven L Yeninas
(74) *Attorney, Agent, or Firm* — Edell, Shapiro & Finnan, LLC (57) ABSTRACT

An NMR probe head (1) having an RF coil arrangement (2a) in a coil region (2) and an RF shielding tube (3) for supply lines leading from a connection region (4) to the coil region. An elongated backbone (5) is arranged inside the shielding tube and has an inherently rigid, mechanically stiff structure having continuous bores and/or connecting channels (5a) which run parallel to the tube axis and accommodate the supply lines. The backbone has a continuously electrically conductive outer surface which leads from the connection region to the coil region and is electrically conductively connected to the conductive inner surface of the shielding tube via connecting elements (6). A continuous electrically conductive contour is formed thereby between the backbone and the shielding tube. This shields against externally incident RF fields and spatially separates the stable mechanical supporting construction and the supply lines from the electronic and RF components.

18 Claims, 5 Drawing Sheets

(51) Int. Cl.
 *G01R 33/46* (2006.01)
 *G01R 33/422* (2006.01)

(58) Field of Classification Search
 USPC .............................. 324/307, 309, 318, 321
 See application file for complete search history.

(56) References Cited

U.S. PATENT DOCUMENTS

| | | | | |
|---|---|---|---|---|
| 5,159,929 | A | * | 11/1992 | Morris .................... A61B 5/055 174/351 |
| 5,200,703 | A | * | 4/1993 | Popp ..................... G01R 33/385 324/318 |
| 5,262,727 | A | | 11/1993 | Behbin et al. |
| 5,594,340 | A | * | 1/1997 | Coyle ....................... G01N 1/08 324/321 |
| 5,751,146 | A | * | 5/1998 | Hrovat ................. G01R 33/341 324/318 |
| 5,781,011 | A | * | 7/1998 | Scholes .................. G01R 33/60 324/316 |
| 6,329,820 | B1 | | 12/2001 | Hasegawa et al. |
| 6,617,851 | B1 | * | 9/2003 | Bergmann ....... G01R 33/34046 324/309 |
| 9,287,606 | B2 | * | 3/2016 | Tkach .................... G01R 33/60 |
| 2007/0013378 | A1 | * | 1/2007 | Ikeda ............... G01R 33/34092 324/322 |
| 2012/0212224 | A1 | * | 8/2012 | Burns .............. G01R 33/34007 324/318 |
| 2014/0125340 | A1 | | 5/2014 | Hunkeler et al. |
| 2014/0167756 | A1 | | 6/2014 | Cho et al. |
| 2018/0340993 | A1 | | 11/2018 | Meister et al. |

FOREIGN PATENT DOCUMENTS

| | | |
|---|---|---|
| DE | 102005025012 B4 | 3/2015 |
| DE | 102017208841 B3 | 10/2018 |
| JP | 05307073 A | 11/1993 |

OTHER PUBLICATIONS

Behr, "Development and optimization of Resonators and detection methods in magnetic nuclear magnetic resonance", in German original ("Entwicklung and Optimierung vonResonatoren . . . ") and in English translation, Dissertation submitted Apr. 2008 , 28 pages.

* cited by examiner

NMR PROBE HEAD WITH A BACKBONE IN THE SHIELDING TUBE

This application claims foreign priority under 35 U.S.C. § 119(a)-(d) to German Application No. 10 2018 202 890.7 filed on Feb. 26, 2018, the entire contents of which are hereby incorporated into the present application by reference.

FIELD OF THE INVENTION

The invention relates to an NMR (=nuclear magnetic resonance) probe head for insertion into a magnet bore of an NMR magnet system, wherein the NMR probe head comprises, in a coil region, an RF coil arrangement which is used to irradiate RF pulses into an NMR measurement sample and/or to receive RF signals from the NMR measurement sample and, in an NMR measurement operating state, is arranged in a measurement region around a magnetic center inside the magnetic bore, wherein the NMR probe head comprises an elongated shielding tube made of electrically conductive material for shielding against external RF radiation, which shielding tube surrounds the electrical, mechanical and RF components of the NMR probe head and through which supply lines are led from a connection region arranged outside the measurement region in the NMR measurement operating state to the coil region.

BACKGROUND

Such an NMR probe head is known, for example, from DE 10 2013 201 110 B3 (=reference [1]).

NMR spectroscopy is a powerful process for instrumental analysis which can be used to determine, in particular, the chemical composition of measurement samples. In this case, RF (=radio-frequency) pulses are irradiated into the measurement sample, which is in a strong static magnetic field, and the electromagnetic reaction of the sample is measured.

In order to reduce line broadening on account of anisotropic interactions, it is also known to allow an NMR sample of solids to rotate during the spectroscopic measurement, tilted at the so-called "magic angle" of approximately 54.74° relative to the static magnetic field ("MAS"=Magic Angle Spinning). The MAS rotor is arranged in an MAS stator using gas bearings, is subjected to temperature control and is caused to rotate with a second gas flow. This means that NMR MAS probe heads comprise a stator which is operated using compressed air and comprises a plurality of compressed gas supplies for said purposes, which compressed gas supplies are separate from one another and are typically led from a pedestal box of the probe head to the measurement region, the actual MAS module.

The present invention relates to an NMR probe head (that is to say generally also for NMR applications without MAS) for introduction into the bore of the magnet system of an NMR spectrometer. The central component in the probe head is the resonator which is used to receive the signal from the measurement sample. The signal is typically relatively weak, and accordingly one of the most important aims is to increase the sensitivity. An additional difficulty is that electromagnetic fields which enter the measurement arrangement from the outside additionally influence the measurement quality.

In order to electromagnetically shield the RF network of the NMR arrangement from the environment, an RF seal is frequently used. The probe head therefore has a generally cylindrical shielding tube in which RF electronic components, in particular RF resonator coils, and possibly the MAS turbine are accommodated, wherein the MAS turbine is arranged in the region of that end of the shielding tube which faces away from the pedestal box. The probe head, with its shielding tube, is typically inserted from below into the vertical room temperature bore of a usually superconducting magnet, is positioned therein and is held therein using hooks, supports, screws or the like. The NMR sample or the MAS turbine is then precisely in the magnetic center of the magnet.

In the concept used in U.S. Pat. No. 5,262,727 A (=reference [2]), the RF seal is placed at the very bottom in a base disk, but complete sealing is not ensured. In addition to the RF tightness, however, good electrical ground contact is also desired. However, in this prior art, it is not certain whether absolute sealing can thus be ensured. Reference [2] discloses, in particular, RF shielding of an RF coil in an NMR probe head comprising cylindrical shields and shielding disks which surround the measurement sample. The additionally required components which are poorly suited to MAS applications are disadvantageous here. There is no rigid backbone, in particular no waveguide array.

U.S. Pat. No. 6,329,820 B1 (=reference [3]) describes an NMR probe head having a shielding tube and a metal-coated separating plate for the purpose of shielding. The shielding tube is permanently connected with metal wires which have been soldered on. A separate backbone and a removable shielding tube are not disclosed.

Patent Abstracts of Japan 05307073 A (=reference [4]) describes RF shielding for an NMR probe head that has a shielding tube which is in the form of a circular waveguide and is appropriately dimensioned for RF attenuation. However, the probe head does not have a separate mechanical backbone.

The German patent application DE 10 2017 208 841.9 (=reference [5]) by a sister company of the applicant was still unpublished on the present filing date. In this concept of the so-called iProbe, the RF seal has been placed at the halfway point for conceptual reasons. This NMR probe head comprises a device for shielding against external RF radiation having an electrically conductive shielding tube which is arranged along the z axis and can be pushed onto a base disk in the z direction around the RF coils and the RF network. A shielding disk is provided at an axial distance from the base disk, and a tensible RF seal is arranged between this shielding disk and the shielding tube in the mounted state and is geometrically configured in such a manner that, in a first mounting state, the shielding tube can be pushed over the shielding disk in an unbraced and force-free manner and, in a second mounting state, the RF seal can be mechanically braced between the shielding disk and the shielding tube in such a manner that an electrically conductive connection to the shielding tube is ensured over the periphery of the shielding disk. However, the disadvantage here is the complicated production of the RF seal.

Furthermore, however, there is also a need for yet additional structural components which provide the probe head with the necessary stability, with the result that the measurement sample (the MAS rotor in the case of MAS applications) is always in the optimum region (and also at the exact magic angle for the MAS) of the magnet. Rigid metal rods are conventionally used as connections between the stator and the pedestal box and are provided, at regular intervals, with metal carrier plates (so-called "frames"). This structure provides the required mechanical stability. However, the disadvantage here is that both the carrier plates and all connecting rods have to be connected to the surrounding shielding tube in an electrically conductive manner at short distances. Without this grounding, natural resonances of the frame elements would be excited by the internal probe head circuit ("internal interference") and external interference signals would be injected into the sample chamber ("external interference"). The latter is caused by the fact that the presence of non-grounded metal components inside the shielding tube reduces the so-called cut-off frequency of the latter, with the result that all interference at the open end of the tube is passed into the interior of the latter.

US 2014/0167756 A1 (=reference [6]) discloses an NMR MAS probe head in which the typical complicated structure of the numerous connecting lines, trimmers, etc. between the pedestal box and the MAS module and the spatial vicinity of mechanical and electronic components can be seen. This embodiment is the "conventional" structure of an NMR MAS probe head.

DE 10 2005 025 012 B4 (=reference [7]) describes a modular MRI probe head, wherein a base part and channel modules together have an elongated structure, wherein the channel modules contain bushings through which RF components but also supply gases can be conducted. The probe head presented here is not produced from a conductive material and is also not used to separate mechanical and electronic components since it is not designed for use in NMR MAS technology.

Reference [1] cited at the outset discloses an NMR MAS probe head having a transport line for the measurement sample which is brought into the MAS stator from below. Said document discloses, in paragraph [0052], that a probe head frame is formed in the interior of the tube, on which frame the stator and various electronic components (not separately illustrated) for an NMR measurement on a measurement sample arranged in the stator are arranged. The first section of the transport line is in the form of a rigid tube here, as a result of which the frame achieves improved stability in comparison with the prior art known until then.

In contrast, however, spatial separation of the mechanical supporting structure and the supply lines from the electronic components, in particular the RF components in the probe head, with simultaneous simplification of the design and an increase in stability would also be desirable.

SUMMARY

One object of the present invention is to provide an RF shielding for an NMR probe head of the type defined at the outset against incident RF fields and said RF shielding is configured to for attenuating incident RF fields in such a manner that the NMR measurement is not significantly influenced. This is intended to be effected without considerable design effort. A further object is to produce a free space which is as large as possible for the detection electronics without the need for additional components, for instance shielding plates, restricting the space. Only electrically insulating materials are used under the detection electronics for the purpose of adjusting the electronic components. The shielding tube is intended preferably to be removable.

This complex assortment of objects is achieved by an NMR probe head of the generic type having the features defined at the outset together with an elongated backbone arranged inside the shielding tube and having an inherently rigid, mechanically stiff structure with continuous bores and/or connecting channels which run substantially parallel to the longitudinal axis of the shielding tube and accommodate electrical supply lines in the connection region and lead them to the coil region. The elongated backbone has a continuously electrically conductive outer surface which leads from the connection region to the coil region and is connected in an electrically conductive manner to the electrically conductive inner surface of the shielding tube via electrically conductive connecting elements, with the result that a continuous electrically conductive contour is formed between the backbone and the shielding tube.

According to one aspect, the present invention is based on an NMR probe head constructed in such a manner that a shielding tube is structurally present over the electronic— and, in the case of MAS applications, mechanical—components and supply lines, as already described in the prior art. A plurality of supply lines and electrical connection such as cables etc. are now led inside the probe head from the connection region to the detection electronics in the connection region (possibly to the MAS stator in the magnet center). These electrical conductors inside the shielding tube, the latter having actually the form of a waveguide, forms a coaxial conductor, with the result that RF waves of any frequency are transmitted well.

All electrical conductive elements, with the exception of the internal conductors of coaxial cables, are connected to the shielding tube in this manner, thus resulting in an electrically conductive cross-sectional area. The probe head is designed with this cross-sectional area over a sufficient length.

The intermediate spaces form waveguides, the cut-off frequency of which is above the fundamental frequency. The frequencies used in NMR technology are between 1 MHz and approximately 1 GHz depending on the isotope to be measured and depending on the applied Bo field. The cross-sectional area and the length of the waveguides are configured in such a manner that an attenuation of more than 60 dB occurs in this frequency range.

Therefore, the invention proposes an elongated backbone which is arranged inside the shielding tube and has an intrinsically rigid, mechanically stiff structure. This structure contains continuous bores and/or connecting channels which run substantially parallel to the longitudinal axis of the shielding tube and accommodate the electrical and electronic—and, in particular in the case of NMR MAS probe heads, also pneumatic and thermal—supply lines in the connection region of the arrangement, possibly on the pedestal box, and lead them to the magnet center (possibly to the MAS module). The elongated backbone also has a continuously electrically conductive outer surface which leads from the connection region to the coil region (possibly from the pedestal box to the MAS module) and is connected to the electrically conductive inner surface of the shielding tube. This produces a continuous electrical contour which extends in the z direction and has the function of a waveguide array beyond cutoff for attenuating electromagnetic fields.

At this point, it is expressly pointed out that the advantages of the invention can be achieved not only in vertical NMR spectrometers but likewise also in NMR systems having a horizontal or oblique z axis. The stated axial positions must then no longer necessarily lie "above" or "below" the NMR magnet system but may possibly also be "to the right" or "to the left" of the latter. In any case, gravity plays a rather minor role in the method of operation of the present invention.

Preferred Embodiments of the Invention

As previously generally conventional in the prior art, the connection region of the NMR probe head according to the invention may be in the form of a pedestal box, as is used in MAS applications, in particular.

Embodiments of the invention are also preferred in which the common electrical contour between the backbone and the shielding tube comprises a plurality of waveguides parallel to the tube axis of the shielding tube, the cross-sectional area of which waveguides is dimensioned in such a manner that each waveguide has a cut-off frequency which is above the highest measurement frequency of the NMR probe head. The usable frequency range which is used in NMR technology is in a range of 1 kHz to 1.5 GHz depending on the isotope and the magnetic field strength. The dimensioning and geometry of the cross-sectional area are not necessarily predefined in this case but rather depend on the attenuation result which is to be achieved and can be achieved by those skilled in the art using the above specifications and suitable measures known in the art.

Advantageous developments of these embodiments are distinguished by the fact that the length of the waveguides resulting from the common electrical contour is selected in such a manner that electromagnetic waves are attenuated by more than 60 dB. The attenuation is preferably more than 80 dB, particularly preferably more than 120 dB.

An electromagnetic wave inside the waveguide below the cut-off frequency decreases exponentially. However, the attenuation rate depends on a plurality of factors. The cross-sectional geometry and area are important, but further effects can also influence the attenuation path on account of the geometry; if, for example, the distance between two adjacent conductive areas within the contour is relatively short (for example 1 mm or less) and a continuous cross-sectional constriction of the waveguide is formed which acts as a capacitive load, the cut-off frequency can be reduced. It is therefore difficult to state in parameters how long the attenuation path must be since this depends on the predefined geometry.

In the case of a circular waveguide, an attenuation of 120 dB results, for example, if the ratio of length to diameter of the waveguide is at least 5:1.

In the case of waveguides having undetermined geometries, the attenuation length is determined in two steps: in a first step the cut-off frequency can be determined if the cross-sectional area of the waveguide is known, and the length must then be adapted in a second step, with the result that the attenuation corresponds to the specifications.

The cross section of the waveguides is preferably selected in such a manner that sufficient attenuation is ensured for an attenuation length of approximately 20 cm.

Very particularly preferred embodiments of the probe head according to the invention are distinguished by the fact that the NMR probe head is in the form of an NMR MAS probe head and comprises an MAS module with an MAS stator, which MAS module is arranged inside the measurement region in the NMR measurement operating state and in which an MAS rotor, including an NMR measurement sample, is positioned using compressed gas bearings and in a temperature-controllable manner during an NMR measurement and can be rotated with the aid of a gas flow. The various advantages of the MAS technology can therefore be used.

Further advantageous embodiments of the invention provide for the connecting channels to also accommodate, preferably all, pneumatic and thermal supply lines and to lead them from the connection region to the coil region. In the case of MAS probe heads, these transport lines with plastic tubes are conventionally led to the MAS stator, which, on the one hand, was previously the cause of a very complicated structure of the probe head. On the other hand, these lines and tubes are also the cause of interference during operation, for example high-voltage flashovers or vibrations caused by the production of compressed gas. This is all now dispensed with if the gas channels in the backbone according to the invention have been removed.

Developments of these embodiments in which a distributor cap in the form of an adapter device is arranged at the MAS-module-side end of the backbone and connects the ends of the continuous bores and/or connecting channels of the backbone to corresponding connections for the electrical as well as the pneumatic and thermal supply lines on the MAS module, preferably with pneumatic and thermal sealing, prove themselves in practice.

Of practical advantage are also embodiments of the NMR probe head according to the invention which are distinguished by the fact that the continuously electrically conductive outer surface leading from the connection region to the coil region is electrically connected to the ground potential using a ground strap in order to ensure good electrical ground contact.

In one type of advantageous embodiments of the probe head according to the invention, the elongated backbone is constructed in one piece. It connects the connection region (possibly the pedestal box) to the coil region (possibly to the MAS module).

Developments of this type of embodiments in which the elongated backbone has a concave structure with an angled or rounded cross section are preferred. It may be advantageous in the case of such an angled structure if the elastic contact elements are fitted on both sides on substantially opposite sides and therefore additionally brace the shielding tube and establish better ground contact to the shielding tube.

The cross sections should preferably be arranged at a distance of at least 1 mm such that a so-called ridge waveguide is not formed.

Particularly preferably, the elongated backbone will be constructed overall in practice from conductive material, preferably metal.

A variant of these developments in which the elongated backbone is constructed from an extruded profile or compression profile with integrated continuous channels for pneumatic, electrical and/or thermal connections is advantageous.

A particularly preferred embodiment provides for the elongated backbone, together with the shielding tube, to be sealed with respect to the environment, at least pneumatically, preferably also thermally, in the NMR probe head according to the invention.

In further preferred embodiments of the invention, the elongated backbone has transverse bores at which further components of the NMR probe head can be fastened. The transverse bores can be used, for example, to fit a conductive circuit board, preferably made of copper, to the backbone. The antenna cables to the RF coil, for example, can be soldered to a copper circuit board if this is not possible on the base body material of the backbone. The backbone can also be formed from aluminum, but this can be soldered only with difficulty.

A development of these above embodiments in which the transverse bores are provided over the entire length of the backbone, preferably at regular axial intervals, is also preferred.

Further advantages of the invention emerge from the description and the drawing. The features mentioned above and the features yet to be stated below can likewise be used, according to the invention, on their own in each case or together in any combinations. The embodiments that are shown and described should not be understood as an exhaustive list and instead are of an exemplary nature for describing the invention.

The invention is illustrated in the drawing and is explained in more detail on the basis of exemplary embodiments.

DETAILED DESCRIPTION

The present invention deals with a specially modified probe head for an NMR spectrometer, in particular also for MAS applications, in which the mechanical supporting structure and the supply lines are spatially separated from the electronic and RF components.

Figure 1:
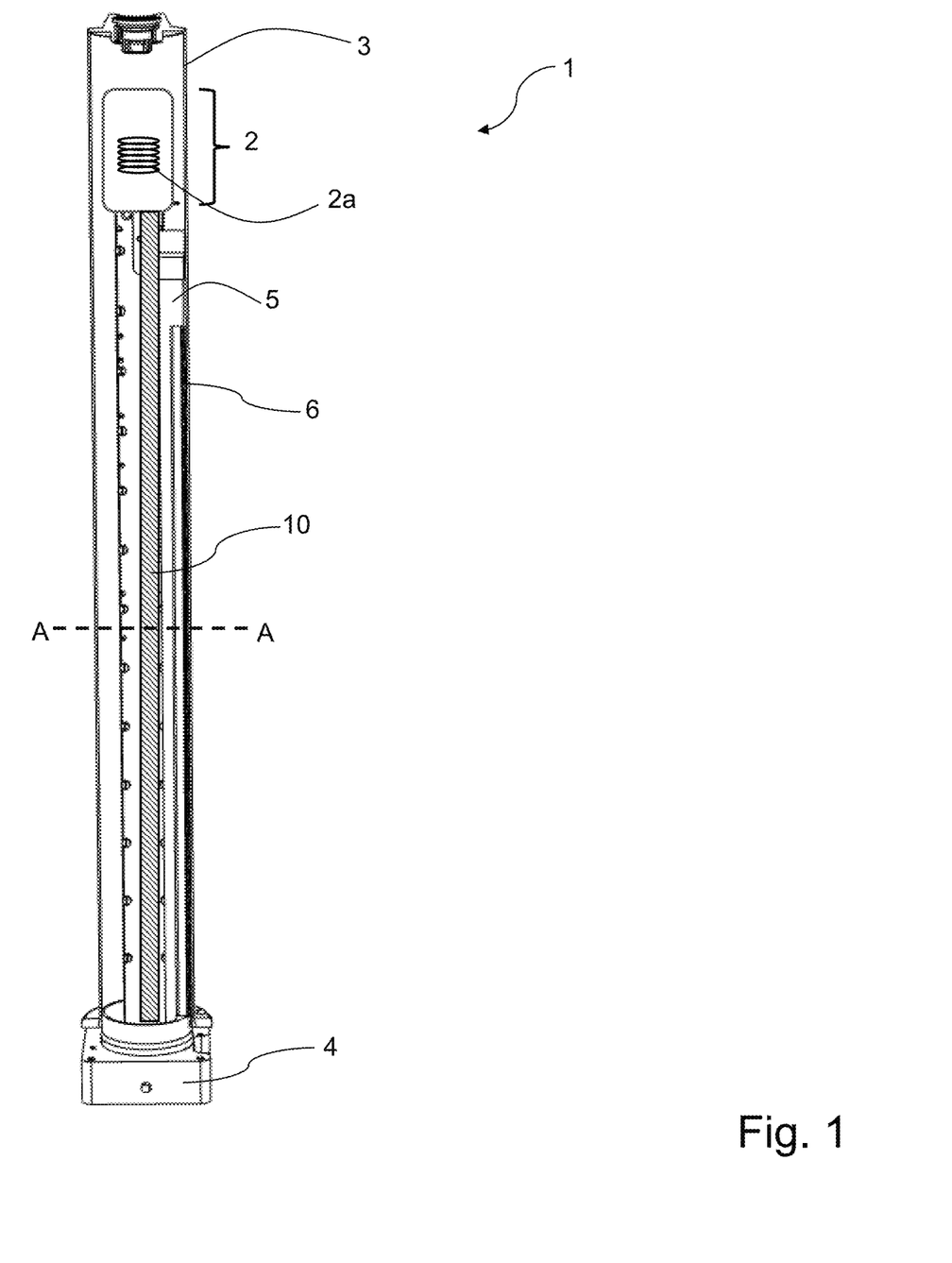
FIG. 1 shows a schematic cut-away illustration of a simple embodiment of the NMR probe head according to the invention.
Figure 5:
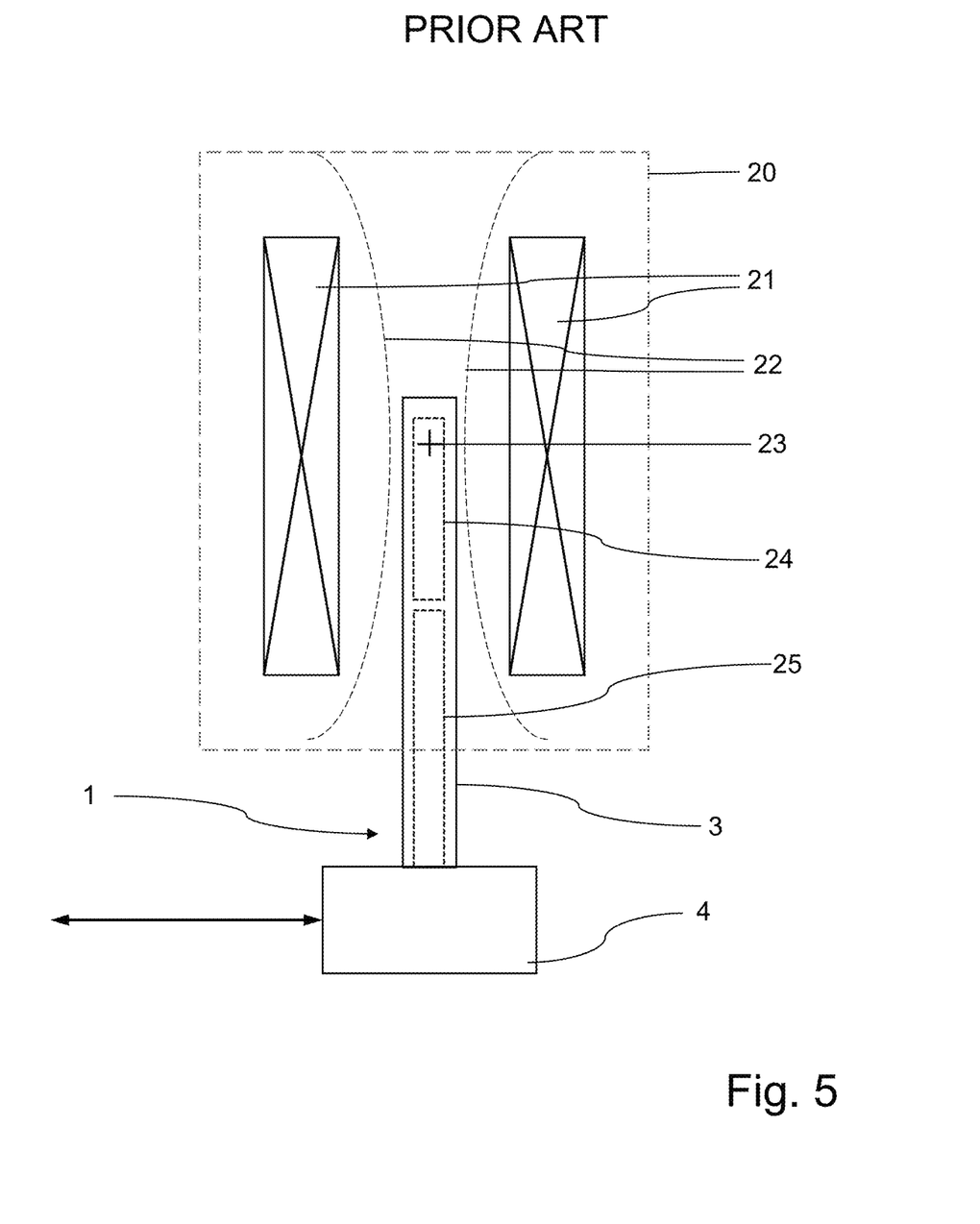
FIG. 5 shows a schematic vertical section through an NMR apparatus according to the prior art with a probe head inserted into the room temperature bore of the magnet from below.

FIG. 1 shows schematically, in a vertical sectional plane, an NMR probe head 1 according to the invention for insertion into a magnet bore of an NMR magnet system 20, as is schematically illustrated in FIG. 5, for instance. The probe head 1 comprises, in a coil region 2, an RF coil arrangement 2a which is used to irradiate RF pulses into an NMR measurement sample and/or to receive RF signals from the NMR measurement sample and is arranged in a measurement region around a magnetic center 23 inside the magnet bore of the NMR magnet system 20 in an NMR measurement operating state. An elongated shielding tube 3 made of electrically conductive material for shielding against external RF radiation is also included, the tube axis of which shielding tube runs substantially parallel to the z axis of the NMR arrangement. The shielding tube 3 surrounds the electrical, mechanical and RF components of the NMR probe head 1 as completely as possible, and supply lines from a connection region 4 arranged outside the measurement region in the NMR measurement operating state to the coil region 2 are led through the shielding tube 3.

Figure 2:
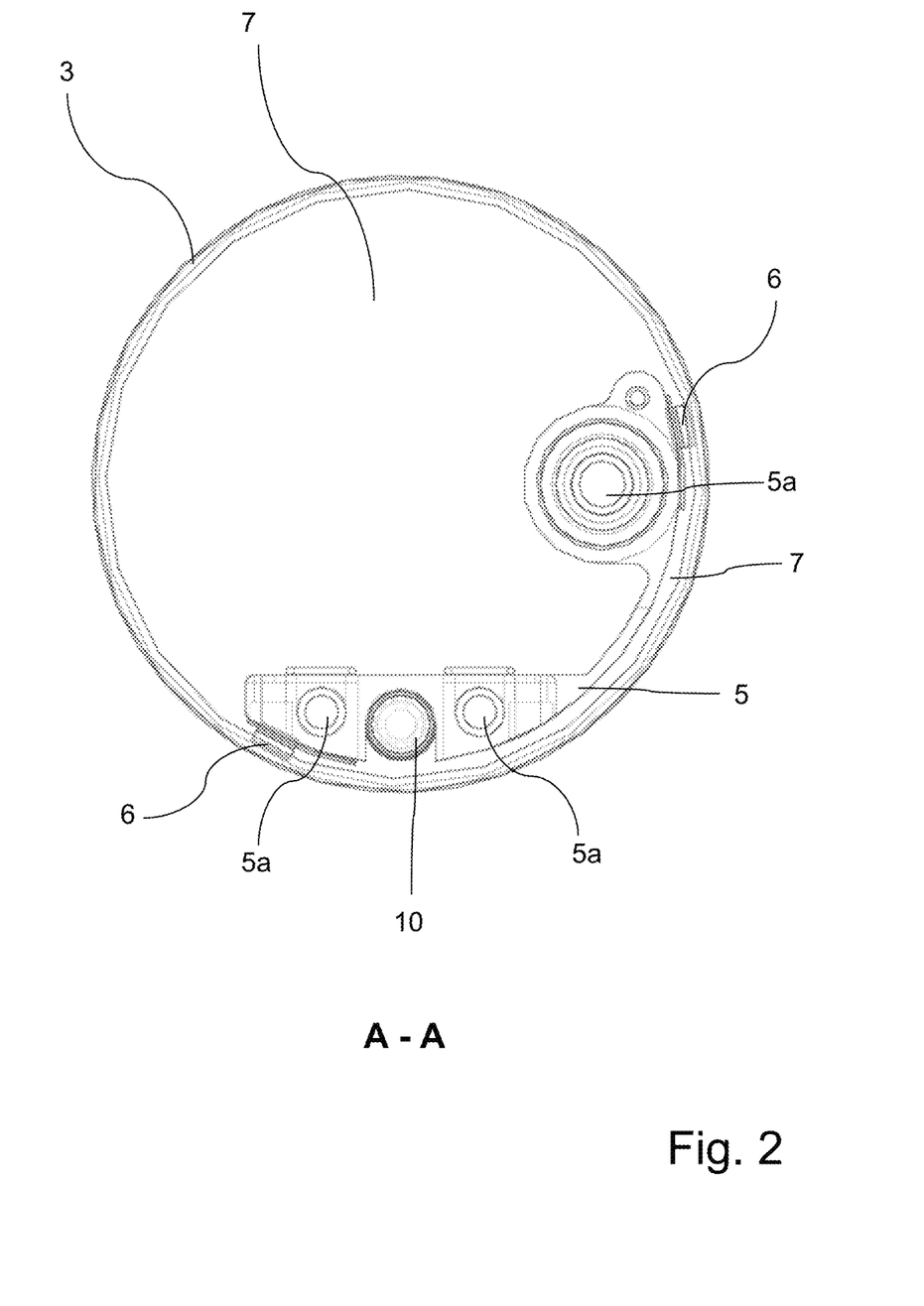
FIG. 2 shows an enlarged schematic cross-sectional illustration in the plane A-A through the shielding tube in the embodiment from FIG. 1 with the backbone and waveguides.

According to the invention, the NMR probe head 1 is distinguished from the known prior art in that an elongated backbone 5 is arranged inside the shielding tube 3 and has an inherently rigid, mechanically stiff structure with continuous bores and/or connecting channels 5a—as illustrated in FIG. 2—which run substantially parallel to the longitudinal axis of the shielding tube 3 and accommodate electrical supply lines in the connection region 4 and lead them to the coil region 2. The elongated backbone 5 also has a continuously electrically conductive outer surface which leads from the connection region 4 to the coil region 2 and is connected in an electrically conductive manner to the electrically conductive inner surface of the shielding tube 3 via electrically conductive connecting elements 6, with the result that a continuous electrically conductive contour is formed between the backbone 5 and the shielding tube 3.

Conductive plastics or foams coated with conductive fabric can also be used as electrically conductive connecting elements 6 from the backbone 5 to the shielding tube 3. However, these have the disadvantage that the contact resistance is relatively high. Therefore, copper or copper beryllium springs are preferably used, to be precise at a distance of preferably 0.5 cm to a maximum of 2 cm, preferably over the entire length of the backbone 5.

As can be well seen in the horizontal cross section which is illustrated in FIG. 2—and is not necessarily true to scale—in the plane A-A of the embodiment according to FIG. 1 through the shielding tube 3 in a plane perpendicular to the tube axis, a multiplicity of bores and connecting channels 5a which run parallel to the tube axis run through the elongated backbone 5. For example, the somewhat larger bore 5a in the right-hand part of the figure may be in the form of a Dewar channel, while the smaller bores 5a on the lower side of the image are air channels which are in the form of circular waveguides and through which other supply lines are conducted.

The important factor is that the common electrical contour between the backbone 5 and the shielding tube 3 constitutes a plurality of waveguides 7—usually filled with air—parallel to the tube axis of the shielding tube 3, the cross-sectional area of which waveguides is dimensioned in such a manner that each waveguide 7 has a cut-off frequency above the highest measurement frequency of the NMR probe head 1. The axial length of the waveguides 7 parallel to the tube axis should be selected, in particular, in such a manner that electromagnetic waves are attenuated by more than 60 dB.

Figure 3:
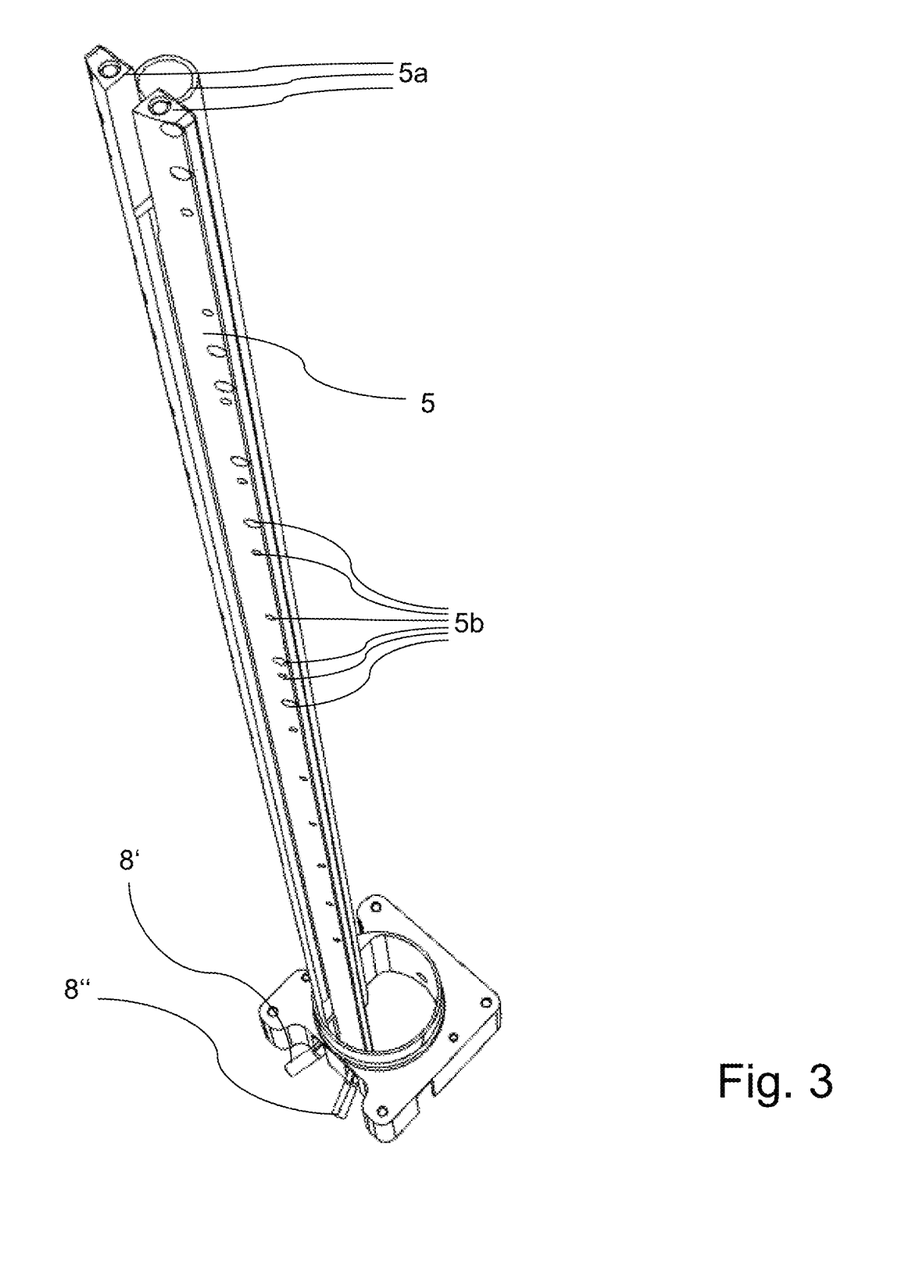
FIG. 3 shows a spatial illustration of a further embodiment of the backbone according to the invention obliquely from above.

A special geometrical configuration of the backbone 5 can be seen in the spatial (but still schematic) illustration in FIG. 3, which backbone has transverse bores 5b at which further components of the NMR probe head 1, for instance electrical supply lines or RF components, can be fastened. These transverse bores 5b can be used for screwing the RF electronics, for example, and are preferably over the entire length of the backbone 5, in particular at regular axial intervals in the direction of the tube axis. The somewhat larger bore 5a in the upper region of the figure can again be in the form of a Dewar channel. On the lower side of the image, a pneumatic supply line 8' and a thermal supply line 8" lead to the two smaller bores 5a which can be seen on the upper side of the figure. These supply lines are required, in particular in MAS applications, in order to lead compressed air for the rotating operation of the MAS module and temperature-controlled fluid for controlling the temperature of the measurement sample from the connection region 4 into the coil region 2.

The spatially continuous contour between the backbone 5 and the shielding tube 3 results in a geometry corresponding to a waveguide array which attenuates the incoming electromagnetic waves along an attenuation path running in the z direction along the tube axis. The bores 5a have an electrically conductive inner surface, with the result that interference caused by conductive metal wires partially inserted into the bores (for example from a Dewar with a heating coil that is led to the center of the backbone 5) is attenuated.

The important factor is that the backbone 5 and the shielding tube 3 form a continuous electrically conductive or metal contour which is electrically connected from the coil region 2 to the connection region 4 along the z direction. However, this connection is also intended to be easily—mechanically—separable since it is constructed from separate components which possibly require separate maintenance. As a result of this common metallically conductive contour, a plurality of waveguides 7 are formed in the z direction and can have different geometries. The bores 5*a* in the backbone 5 preferably have a circular cross section and are therefore a circular waveguide, preferably with a diameter of 1 mm to 15 mm, depending on the use.

Depending on the geometry of the backbone 5 and the type and number of electrically conductive connecting elements 6 between the backbone 5 and the shielding tube 3, one or more waveguides 7 with more complex cross-sectional geometries are formed between the backbone 5 and the shielding tube 3.

Conductive plastics or foams coated with a conductive fabric can be used, for example, for the electrical connection from the backbone to the shielding tube. However, these have the disadvantage that the contact resistance is relatively high. Therefore, spring elements having a material with good electrical conductivity, in particular copper beryllium springs, are preferably used, to be precise at short distances on the backbone 5, in particular at a distance of preferably 0.5 cm to a maximum of 2 cm, over the entire length of the backbone 5, with the result that the contact resistance is kept as low as possible. If these springs are fastened on both sides on substantially opposite sides of the backbone 5, the electrical contact between the backbone 5 and the shielding tube 3 can be increased through mutual contact pressure. Furthermore, the shielding tube 3 can be well centered in this manner.

Not all supply lines run into the bores 5*a*. For instance—as can be seen in FIGS. 1 and 2—the coaxial cables 10 to the RF coil arrangement 2*a* are preferably connected in a mechanical and electrically conductive manner on the outer wall of the backbone 5.

Figure 4:
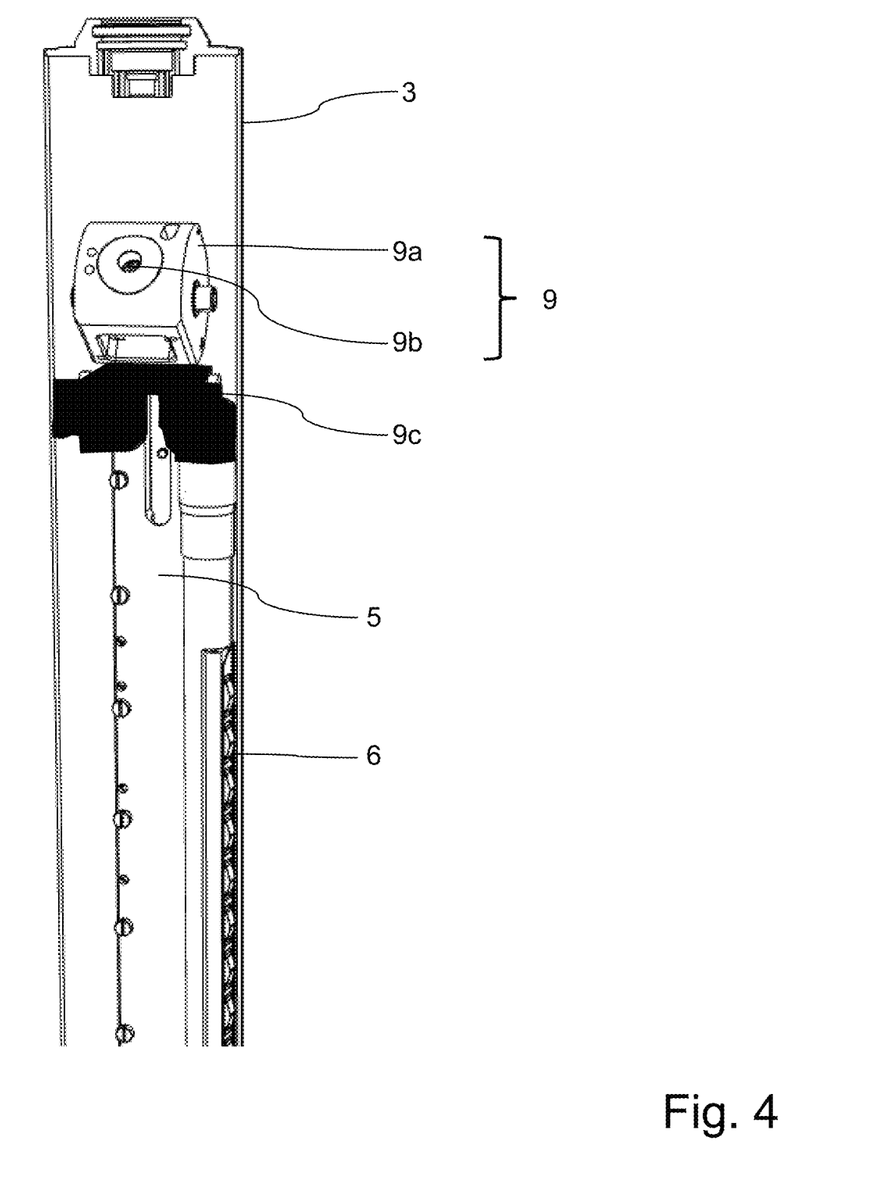
FIG. 4 shows a schematic longitudinally cut-away partial illustration of a probe head according to the invention with an MAS module.

The backbone 5 is preferably produced as an extruded profile or as a compression profile with integrated pneumatic channels 5*a*. Such an extruded profile is available in different lengths in a cost-effective manner and can be processed relatively easily. It preferably consists of aluminum. The backbone 5 gains high intrinsic rigidity from a concave structure having an angled or rounded cross section, with the result that no further reinforcements are required. This is necessary in order to ensure accurate positioning of the RF coil arrangement 2*a* and, in particular, an MAS module 9 with an MAS stator 9*a* and an MAS rotor 9*b*, as can be seen in the spatial illustration in FIG. 4. The same applies to the fastening of the components which can preferably be screwed to the side of the backbone 5.

Those bores 5*a* which can transport liquid or gaseous media (for example compressed air or temperature-controlled fluids) from the connection region 4 to the coil region 2 are also introduced inside the backbone 5. Other channels, for example for leading through sensors or additional insulation (for example with a Dewar), can also be provided in the backbone 5. As a result of the design made from conductive material, other components, for example heating wires or temperature sensors, can also be fitted inside the channels without impairing the insulation of the test probe interior with respect to external interference signals. Temperature sensor wires which project into the measurement region should be sealed at the upper end of the backbone with electrically conductive material, for example through soldering, since a coaxial conductor is otherwise produced. Heating wires typically end halfway along the backbone, as a result of which there is still a sufficient attenuation path.

In the case of MAS probe heads, a distributor cap 9*c* adjoins the upper end of the backbone 5, which distributor cap, as an adapter piece, establishes the connections to the MAS module 9, more specifically to the MAS stator 9*a*, in the backbone 9 and seals them. As a result, the MAS module 9 is aligned and correctly positioned. This connection can also be suitable for applications in temperature ranges considerably above or significantly below room temperature.

The backbone 5 optionally also comprises bores 5*a* at which further components can be fastened. As already stated above, the bores 5*a* can be provided over the entire axial length and preferably at regular intervals, in a similar manner to a bookshelf on which the shelves can be fastened at any desired height. If further metal components are led through the probe head 1, they may therefore be grounded at the same time and with the required minimum distance.

The backbone 5 likewise optionally also comprises bores 5*a* or forms which can guide and/or mount an adjustment axis (for example the angle adjustment axis for the MAS stator 9*a*).

Together with the shielding tube 3 and a base plate, the backbone 5 can be sealed with respect to the environment, with the result that the complete interior of the probe head 1 can be placed under elevated pressure or reduced pressure.

The illustration in FIG. 5 which is again kept very schematic finally shows an NMR magnet system 20 having $B_0$ coils 21 for generating the static NMR magnetic field, the field lines 22 of which are likewise indicated in the drawing. Such arrangements are known, in principle, from the prior art. In this case, the coil region 2 of a probe head 1 is arranged in a measurement region around a magnetic center 23 inside the magnet bore—not specifically illustrated for the sake of clarity—of the NMR magnet system 20 in an NMR measurement operating state. Inside the shielding tube 3 of the probe head 1, a first installation space 24 for RF electronics is indicated in the upper part projecting into the magnetic center 23 and a second installation space 25 for supply lines is indicated in the adjoining lower part which leads into the connection region 4 in the form of a pedestal box.

LIST OF REFERENCE SIGNS

1 NMR probe head
2 Coil region
2*a* RF coil arrangement
3 Shielding tube
4 Connection region
5 Backbone
5*a* Bores and connecting channels
5*b* Transverse bores
6 Electrically conductive connecting elements
7 Waveguide
8' Pneumatic supply lines
8" Thermal supply lines
9 MAS module
9*a* MAS stator
9*b* MAS rotor
9*c* Distributor cap
10 Coaxial cable to the RF coil
20 NMR magnet system
21 B0 magnet coils
22 Magnetic field lines
23 Measurement region=magnetic center 24 Installation space for RF electronics
25 Installation space for supply lines

LIST OF REFERENCES

Publications taken into account for the assessment of the patentability:
[1] DE 10 2013 201 110 B3
[2] U.S. Pat. No. 5,262,727 A
[3] U.S. Pat. No. 6,329,820 B1
[4] Patent Abstracts of Japan 05307073 A
[5] DE 10 2017 208 841.9
[6] US 2014/0167756 A1
[7] DE 10 2005 025 012 B4

What is claimed is:

1. An NMR probe head configured for insertion into a magnet bore of a nuclear magnetic resonance (NMR) magnet system and comprising:
in a coil region, a radio frequency (RF) coil arrangement configured to irradiate RF pulses into an NMR measurement sample and/or to receive RF signals from the NMR measurement sample and, when arranged in an NMR measurement operating state, is arranged in a measurement region around a magnetic center inside the magnet bore,
electrical, mechanical and RF components,
an elongated shielding tube (a) made of electrically conductive material that shields against RF radiation external to the probe head, (b) having a longitudinal axis, (c) surrounding the electrical, mechanical and RF components, and (d) through which electrical supply lines extend from a connection region arranged outside the measurement region in the NMR measurement operating state to the coil region,
an elongated backbone (a) arranged inside the shielding tube (b) having an inherently rigid, mechanically stiff structure with continuous bores and/or connecting channels which run at least substantially parallel to the longitudinal axis of the shielding tube and accommodate the electrical supply lines, and (c) having a continuously electrically conductive outer surface which leads from the connection region to the coil region and is electrically conductively connected to an inner surface of the electrically conductive shielding tube via electrically conductive connecting elements, providing a continuous electrically conductive contour between the backbone and the shielding tube, wherein the continuous electrical contour between the backbone and the shielding tube comprises a plurality of waveguides parallel to the longitudinal axis of the shielding tube, and wherein a cross-sectional area of the waveguides is dimensioned such that each of the waveguides has a cut-off frequency which is above a highest measurement frequency of the NMR probe head.

2. The probe head as claimed in claim 1, wherein the connection region is configured as a pedestal box.

3. The probe head as claimed in claim 1, wherein a length of the waveguides resulting from the common electrical contour is selected such that electromagnetic waves are attenuated by more than 60 dB.

4. The probe head as claimed in claim 1 and configured as an NMR MAS probe head, said probe head further comprising a magic angle spinning (MAS) module with an MAS stator, wherein the MAS module is arranged inside the measurement region in the NMR measurement operating state, and wherein an MAS rotor is configured to hold an NMR measurement sample in a temperature-controlled position and mounted to rotate using a flow of compressed gas during an NMR measurement.

5. The probe head as claimed in claim 4, further comprising a distributor cap forming an adapter device, arranged at an MAS-module-side end of the backbone, and connecting ends of the continuous bores and/or the connecting channels of the backbone to corresponding connections for the electrical, pneumatic and thermal supply lines on the MAS module.

6. The probe head as claimed in claim 5, wherein the connecting ends are connected to the corresponding connections for the electrical, pneumatic and thermal supply lines on the MAS module with pneumatic and thermal sealing.

7. The probe head as claimed in claim 1, wherein the connecting channels additionally accommodate pneumatic supply lines and thermal supply lines, and lead the pneumatic and thermal supply lines from the connection region to the coil region.

8. The probe head as claimed in claim 1, wherein the continuously electrically conductive outer surface leading from the connection region to the coil region is electrically connected to ground potential with a ground strap.

9. The probe head as claimed in claim 1, wherein the elongated backbone is a one-piece construction.

10. The probe head as claimed in claim 9, wherein the elongated backbone has a concave structure with an angled or rounded cross section.

11. The probe head as claimed in claim 9, wherein the elongated backbone is constructed overall from conductive material.

12. The probe head as claimed in claim 11, wherein the elongated backbone is constructed from metal.

13. The probe head as claimed in claim 11, wherein the elongated backbone is constructed from an extruded profile or a compression profile with integrated continuous channels for pneumatic and/or electrical and/or thermal connections.

14. The probe head as claimed in claim 1, wherein the elongated backbone, together with the shielding tube, is sealed at least pneumatically with respect to an environment surrounding the shielding tube.

15. The probe head as claimed in claim 14, wherein the elongated backbone, together with the shielding tube, is sealed with respect to the environment at least pneumatically and thermally.

16. The probe head as claimed in claim 1, wherein the elongated backbone has transverse bores configured to fasten further components of the NMR probe head.

17. The probe head as claimed in claim 16, wherein the transverse bores are provided over an entire length of the backbone.

18. The probe head as claimed in claim 17, wherein the transverse bores are provided at regular axial intervals over the entire length of the backbone.

* * * * *